United States Patent [19]

Gimpelson et al.

[11] Patent Number: 4,705,596
[45] Date of Patent: * Nov. 10, 1987

[54] SIMULTANEOUS PLASMA SCULPTURING AND DUAL TAPERED APERTURE ETCH

[75] Inventors: George E. Gimpelson, Indialantic; Cheryl L. Holbrook; Frederick N. Hause, both of Palm Bay, all of Fla.

[73] Assignee: Harris Corporation, Melbourne, Fla.

[ * ] Notice: The portion of the term of this patent subsequent to Nov. 10, 2004 has been disclaimed.

[21] Appl. No.: 723,238

[22] Filed: Apr. 15, 1985

[51] Int. Cl.⁴ .................. H01L 21/308; H01L 21/32; B44L 1/22
[52] U.S. Cl. .................................. 156/643; 156/644; 156/646; 156/657; 156/659.1; 430/313; 430/317; 148/DIG. 161
[58] Field of Search ............... 156/643, 644, 646, 657, 156/659.1, 662, 653; 430/313, 317; 148/DIG. 161

[56] References Cited

U.S. PATENT DOCUMENTS 4,484,979 11/1984 Stocker ............................. 156/643
4,522,681 6/1985 Gorowitz et al. .................. 156/643
4,554,048 11/1985 Manocha ............................. 156/643
4,560,436 12/1985 Bukhman ............................. 156/643

FOREIGN PATENT DOCUMENTS 57-136327 8/1982 Japan .................................... 156/643

OTHER PUBLICATIONS

Briska, et al., "Shortened Method for Opening Via Holes", IBM Tech. Disclosure Bull., vol. 21, No. 8, Jan. 1979, p. 3229.

Primary Examiner—S. Leon Bashore
Assistant Examiner—Andrew J. Anderson
Attorney, Agent, or Firm—Thomas N. Twomey; Charles C. Krawczyk; William A. Troner

[57] ABSTRACT

A method of planarizing a semiconductor layer by use of a plasma etch step which also etches vias having a tapered profile is made possible by selecting a conformal layer preferably of a different material than the material through which the via is to be provided such that a plasma etch will establish differing etch rates in the conformal and underlying layers.

12 Claims, 7 Drawing Figures

SIMULTANEOUS PLASMA SCULPTURING AND DUAL TAPERED APERTURE ETCH

BACKGROUND AND SUMMARY OF THE INVENTION

The present invention relates generally to semiconductor device manufacture and, particularly, to improvements in plasma planarization of semiconductor device layers and the formation of interlevel interconnect locations. More particularly, the present invention relates to a method for simultaneously altering the underlying topography and the formation of interlevel interconnect apertures having an improved profile to facilitate reliable metal adherence and coverage to thereby improve device yields.

As integrated circuit geometries increase in complexity and decrease in dimensions it becomes increasingly important to provide component layers with smooth or planar surface topographies. Planar surfaces are important in MOS technologies where initial layer topographies are often extremely rough. For example, where a metallic or conductive path is applied to a semiconductor substrate, the sidewalls and edges of that path typically present substantial steps which may be unacceptable for certain subsequent processing. For instance, these steps would often inhibit proper application of additional device layers. Also, in the fabrication of multilevel devices it is generally necessary to form apertures through one device layer to an underlying layer. The sidewall height and angle of these apertures is often too abrupt for good metal coverage.

To reduce sidewall angles and soften edges, previous fabrication processes have included high temperature "reflow" techniques. The substrate and glass thereon would be heated to temperatures where the glass softens and starts to melt. The substrate, however, maintains its stability at these temperatures. Unfortunately, reflow techniques have often proved unsatisfactory where metal is used. To insulate these paths, oxide layers are typically applied between them. These oxide layers substantially conform to the underlying surface topography. Thus, subsequent paths applied directly to the oxide would not have a planar base surface. Without a planar base surface, designing complex, multi-layer circuits become extremely difficult. Attempts to apply reflow techniques to the oxide layers are not successful. Temperatures high enough to soften the oxide and cause it to flow into and fill surface steps also cause underlying metal paths to melt or peel off adjacent layers or alloy with the silicon. This results in silicon surface pits and resultant device failures. Further, such high temperature processing will generally enlarge device dimensions and promote poor features size control which subsequently causes loss of device packing density.

Recently, low temperature plasma etching techniques for smoothing rough and irregular surface topographies have been developed. These are often referred to as "plasma planarization" or "plasma filing". As seen in the sectional view of FIG. 1, plasma planarization typically involves the use of a sacrificial layer 10 which is applied over rough topography 20 of insulating layer 30. Rough topography 20 may, for example, result from conformity of insulating layer 30 to metal path 40 formed on insulative layer 50 of substrate base 60. Prior research and experimentation have been directed toward achieving a planar surface shown by dashed line 15 on sacrificial layer 10. This multi-layered product is subjected to plasma etching in a gas environment to completely or partially remove sacrificial layer 10 and portions of insulating layer 30. Sacrificial layer 10 is etched away at the same rate as the material of insulating layer 30. As a result, the topography of relatively smooth surface 15 can be replicated on the surface of insulating layer 30 without detrimentally effecting metal path 40.

Such plasma planarization techniques have been used to smooth surfaces of several materials, including polysilicon, nitrides, and various glasses. A variety of sacrificial layers have also been used, including photoresists, polyimide, and nitrides. Unfortunately, while previous plasma planarization techniques may be suitable for fabrication of some larger, less detailed integrated circuits, they do not produce surfaces which are sufficiently planar for many smaller and more complex circuit devices.

Further difficulties also arise with the relatively narrow processing constraints of these prior techniques. According to these prior techniques, the ratio of the etch rates of the sacrificial layer to the underlying insulating layer must, as nearly as possible, be unity if the topography of surface 15 is to be properly replicated. Even the smallest deviation from a unity ratio is considered undesirable.

A solution of the above difficulties has been described in copending U.S. Ser. No. 591,597 entitled "Plasma Sculpturing With A Non-Planar Sacrificial Layer" and owned by the assignee of the present invention now U.S. Pat. No. 4,515,652. The above patent describes a method of plasma planarization of the surface topography of a substrate layer wherein a sacrificial layer, having an etch rate substantially different from the etch rate of the substrate layer, is applied to the surface topography of that substrate layer. The sacrificial layer 10 and substrate layer 30 are then plasma etched to remove the sacrificial layer 10 and portions of the substrate layer 30. The ratio of substrate to sacrificial layer etch rate can be controlled to compensate for non-planar surface features of the sacrificial layer such that the resulting substrate surface topography is planar. Control of this etch rate ratio is accomplished by selecting appropriate materials forming the sacrificial layer for a given plasma environment and by selecting the appropriate plasma environment for a given material forming the sacrificial layer. This process is a "low temperature" process which is suitable for multilayer devices which may have previously applied metal contacts or lines that could be damaged by temperatures high enough to cause the surface layers to melt or flow.

The present invention relates to an improved method of fabricating semiconductor devices, and more particularly to the fabrication of devices incorporating multilevel interconnect technology.

A desirable process for the fabrication of multilevel interconnect semiconductor devices would provide smoothing of the interlevel dielectric, etching of apertures which will be used for interlevel connections and tapering of the apertures to improve interconnect step coverage into the apertures without requiring high temperatures. The most common method of tapering the apertures is to depend on the taper of the aperatures in the photoresist being transferred to the oxide during the erosion of the photo resist. This method of tapering the photoresist is not easily controlled thus it is difficult to obtain uniformity in the manufactured end products. Gwozdz, U.S. Pat. No. 4,451,326 issued May 29, 1984 is illustrative of the attempts being made to provide an improved aperture profile for facilitating good metal coverage in the aperture. The multi-step process described by Gwozdz is cumbersome and only serves to reduce the step height into the aperture.

Another approach to improving planarization has relied on the melting of the aperture sidewalls causing the apertures to taper, thus improving metal adherence. However, such techniques have not provided reliable device integrity. A description of this technique is provided by Kern and Rosier, "Advances in Deposition Processes for Passivation Films" J. Vac. Sci. Technical, Vol. 14, No. 5, Sept./Oct. 1977.

It is an object of the present invention to provide a tapered profile to an oxide aperture while simultaneously utilizing the sculpturing technology described herein.

It is a further object of the present invention to simultaneously provide a tapered aperture and a sculptured underlying topography without requiring any increase in the number of process steps beyond those ordinarily required for forming a photoresist opening and aperture etch.

DETAILED DESCRIPTION OF THE INVENTION

For purposes of this specification the term aperture is intended to cover all openings through layers in a semiconductor device which openings have as their purpose the electrical interconnection of overlying and underlying conductors or semiconductors. Additionally, the characterization of a device layer or semiconductor layer as undesirable or unsatisfactory means that it would be preferred that the topography be altered in some manner and these terms include rough surfaces which are preferably to be smoothed such as through a planarization process. The term sculpturing, while used for the most part to refer to planarization is intended to include any alteration of a layer's topography in a selected manner.

The opening of a preferentially profiled aperture in an oxide without any increase in the number of process steps is accomplished pursuant to the present invention as described herein with reference to the accompanying drawings.

Figure 1:
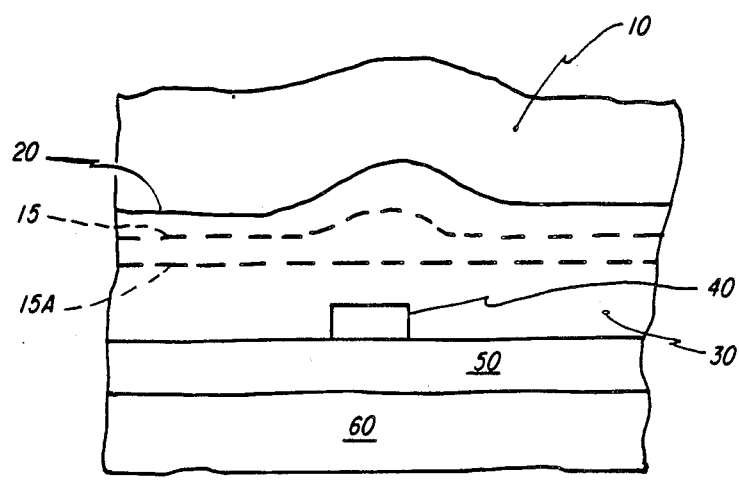
FIG. 1 is an illustration of a plasma planarization technique.
Figure 2:
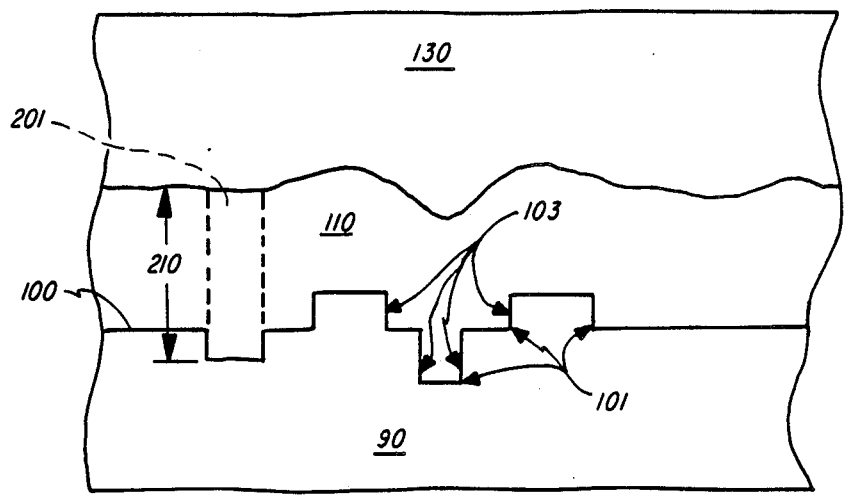
FIG. 2 is an illustration of a multilayer semiconductor structure having an undesirable topography.

FIG. 2 illustrates a non-planar semiconductor surface 100 showing irregularities 101 resulting from both device and conductor formation on a first level of a multilevel semiconductor device. The surface irregularities include steps 103 some of which are sufficiently high and steep so as to render subsequent layer coverage unsatisfactory due to difficulties in obtaining consistent and uniform coverage. It may be particularly difficult to obtain metal coverage over such steps. Thus, a planarization layer 110 may be applied over the non-planar semiconductor surface. The planarization layer should be of a highly conforming material which will provide good step coverage. A suitable planarization layer can be formed of silicon dioxide. This layer, while generally conforming to the non-planar semiconductor surface, is somewhat less rough than the underlying surface to which it is applied.

Apertures 201 between the device layers 120 and 90 through the isolating or insulating materials 110 which separate the device layers 120 and 90 are preferably made as small as practicable while providing a sufficient opening for establishing the desired electrical interconnection. As previously described, if the step height 210 and side-wall steepness of this aperture 201 are too great, metallic step coverage will be severely reduced and it will be detrimental to end product reliability. The deviation from vertical in the Figure is near 0° thus having a vertical or steep sidewall. Thus, according to the present invention, apertures may be formed which do not have vertical side-walls.

Figure 3:
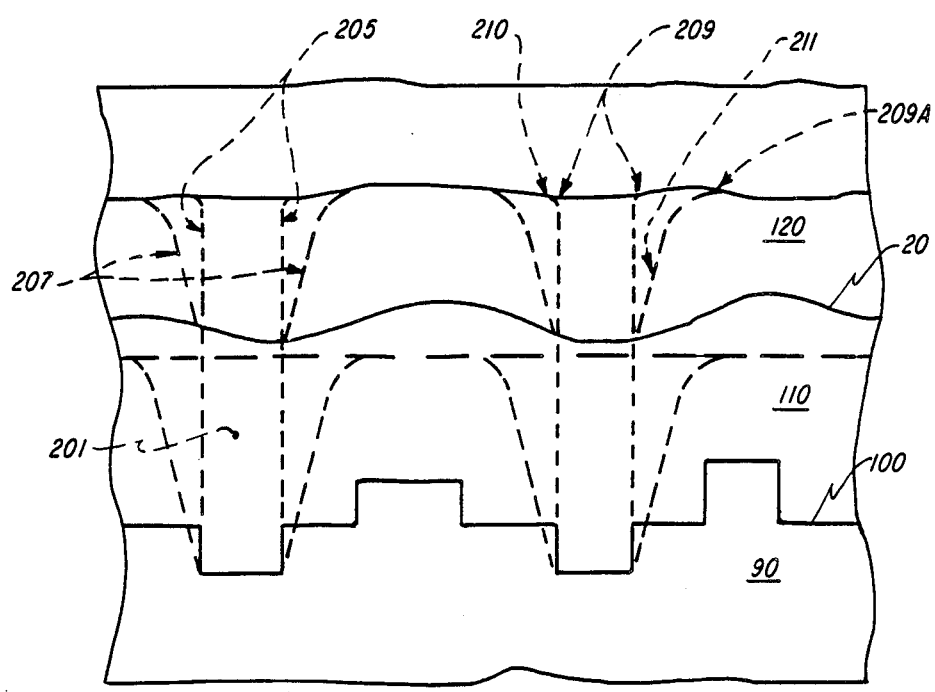
FIG. 3 is an illustration of the various layers at one stage in the process of the invention.

Referring now to FIG. 3, a photoresist layer 120 is applied over the insulating oxide 110 in order to form a mask to demarcate the locations where apertures 201 are to be formed. The creation of tapered sidewalls in the oxide 110 may be for example facilitated through the prior tapering of the side-walls 205 in the photoresist 120 overlying the oxide.

It has been discovered that a pretreatment of the photoresist 120 by an appropriate energy source, for instance a blanket exposure to a source of broad spectrum light such as is provided by an exposure under a Perkin Elmer 240, with an aperture of one and a scan rate of 75, alters the photoresist's characteristics exhibited when subsequently exposed to a dry etch such as is used in a reactive ion etcher.

Figure 4:
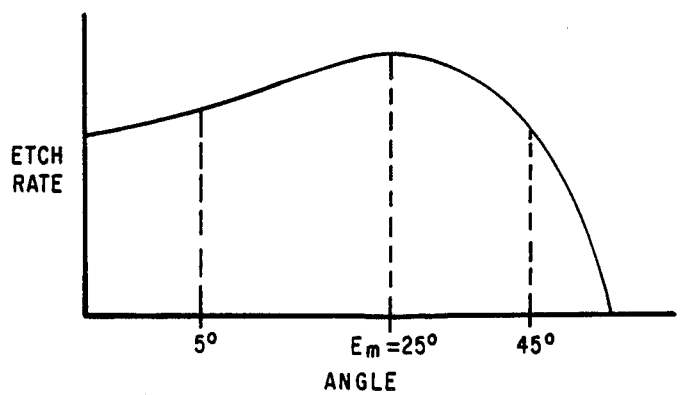
FIG. 4 is a graph showing the relationship between etch rate and angle of plasma etch.
Figure 5A:
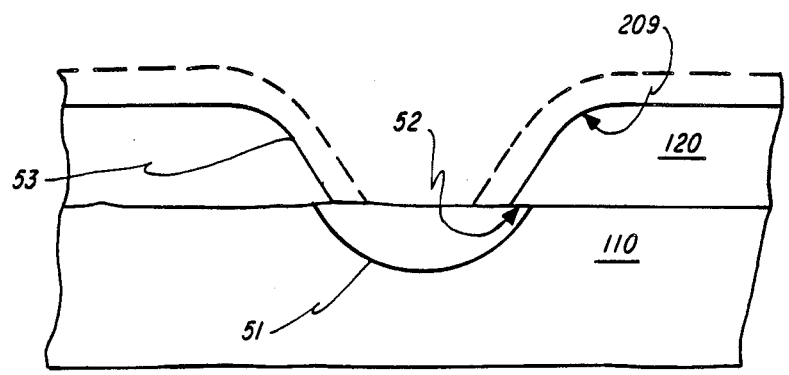
FIGS. 5a, 5b, 5c show the progressive stages in the oxide etch process of the invention.
Figure 5B:
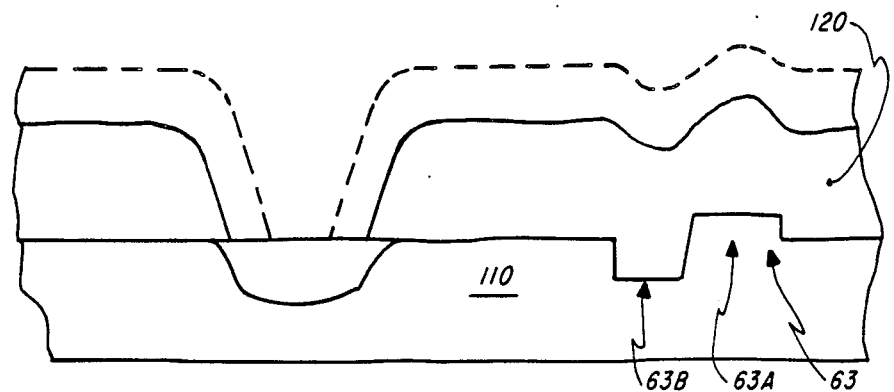
Figure 5C:
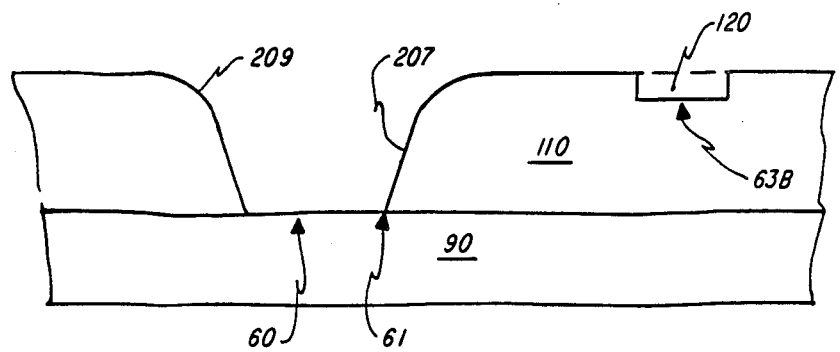

As a result of the above exposure, the photoresist is modified such that the etching process, in this case a dry etch, facets the sidewall along a non-vertical angle as shown by dashed line 207. It has been found that the etch rate of the pretreated photoresist varies with variations in the angle of incidence of the plasma etch. FIG. 4 shows the relationship of etch rate to the angle for most applications is between about 5° and 45° from vertical thus facilitating formation of a desirable taper. Due to the fact that etching occurs fastest at a particular angle, 25° in this instance, the slope of sidewall 205 is ultimately established at or near this angle.

However, the desired faceting may not commence uniformly at all apertures due to the absence of an exposed surface aligned with the preferred facet angle. It has been found that this possible variable in the faceting process can be minimized by rounding the peripheral edges 209 of the photoresist aperture prior to commencing the plasma etch. This rounding results in the exposure of a curve such that the curved face 210 passes through the desired facet angle and provides a starter location for the preferred facet to be etched. As the plasma etch proceeds, the preferred facet grows until the inner wall 211 is uniformly etched at the preferred angle and the rounded peripheral edge 209 is maintained at the new peripheral edge 209A.

Rounding is preferred over other techniques for exposing the preferred facet due to the relative ease of obtaining a rounded edge after the appropriate pretreatment described above. All that need be done to round the edge is to heat the photoresist. In addition to rounding the photoresist edges, heating the photoresist prevents destructive outgassing during subsequent evacuation. In order to avoid the need for extra process steps, the photoresist may be sufficiently heated during an existing photoresist bake step typically performed to provide a limited and controlled non-destructive outgassing of the photoresist prior to exposing the photoresist to evacuation for plasma etching.

Having formed the rounded edge 209, the plasma etch is commenced. All plasma etching for surface planarization, photoresist taper etching and oxide via etching is done without removing the wafers from the chamber. In this manner, no additional processing is needed. The etch may commence for instance with an $O_2$ plasma which tapers the photoresist without etching the oxide, or an anisotropic oxide etch which is highly selective to photoresist which can be used to define the base of the aperture. After faceting of the photoresist the oxide etch may be commenced.

In the part of the oxide etch process which planarizes the oxide and etches the oxide apertures, both the oxide and the photoresist are etched under conditions which establish an oxide etch rate different than the photoresist etch rate. Additionally, the photoresist etch should have both anisotropic and isotropic components. The aperture 201 thus formed in the oxide will have a dual taper providing an optimized surface for subsequent metallization.

A dual taper is formed as shown in FIGS. $5_a$, $5_b$ and $5_c$. When the oxide etch commences, as in $5_a$, the etch has the typical U-shaped cross-section 51 with slight undercutting of the photoresist at 52 due to the isotropic component of the plasma etch. The dashed lines show the layer boundaries prior to commencement of the etch and the solid lines show the boundaries at the intermediate etch stage. This figure additionally shows that the photoresist 120 is etched both laterally and vertically such that the angle with respect to vertical of the sidewalls 53 is maintained constant or nearly constant and that the rounded peripheral edge 209 is maintained as the etch progresses. As the etch continues, as shown in FIG. $5_b$, the photoresist continues to be etched although at a slower rate than the oxide is etched. Also, the photoresist is laterally etched, enlarging the top of the oxide aperture as the etch continues. This figure additionally shows a rough portion 63 of the oxide which is covered by the photoresist 120. As can be seen, the photoresist is somewhat more planar than the surface of the oxide at rough portion 63. Due to the etch process which is in progress, the smoother surface of the photoresist is being preserved as the upper surface of the formed structure. Finally, as shown in FIG. $5_c$, the aperture is completed through the oxide. As shown, the sidewall 207 in the lower portion of the aperture is faceted at the preferred etch angle thus having a first taper and the upper portion of the aperture at the peripheral edge 209 is rounded such that it curves open to provide a relatively smooth transition to the top of the oxide layer. It has also been found that the bottom of the aperture 60 may have a curved transition 61 onto the underlying layer thus avoiding the need to metalize the sharp corner that prior aperture forming processes created. This aperture profile will provide for improved step coverage when an electrically conductive material is applied. Previously existing problems associated with aperture metallization over substantial step heights are obviated by the present invention. Also, it can be seen that the rough portion 63 has been sculptured to provide a desirable smooth surface. This is accomplished as a result of the greater than unity ratio of oxide to photoresist etch rate. When the bump $63_a$ shown in FIG. $5_b$ is exposed by the advancing etch, the exposed oxide is etched more quickly than the surrounding photoresist thereby reducing the height of the bump until the surface is planarized. In the valley $63_b$ the photoresist is not removed because the etch is stopped prior to complete photoresist removal. However, there may be instances where all the photoresist is removed or where even less is removed than shown in FIG. $5_c$. In any of these events the surface is sculptured in response to the thickness of the photoresist, the ratio in oxide to photoresist etch rates and the topography of the oxide layer.

While the invention has been described specifically with respect to a process including the tapering of the photoresist aperture, it is to be understood that the simultaneous planarization and aperture etch utilizing a dry plasma etch need not include photoresist or mask layer tapering and need not include the specifically disclosed process for photoresist tapering.

Furthermore, while the subject invention has been described with respect to the tapering of apertures, the present invention may also find application where other sharp or abrupt steps exist on a surface to be planarized. For instance, substantial step heights exist at the vertical edges of thin oxide areas, moats and interconnects. The process of the present invention can be used to create an improved profile for subsequent processing at any location where a substantially vertical profile initially exists. In many of these applications, a top corner of the exposed vertical edge would be treated in the same manner as the peripheral edge of the aperture previously described. By providing a photoresist layer at the location of the step in the underlying oxide and the patterning the photoresist to have a vertical edge which is coplanar with the vertical oxide edge of the oxide step, the photoresist can be tapered by a RIE which does not attack the oxide. Then, the RIE can be altered to anisotropically etch the oxide and the photoresist, and the taper of the photoresist will be transferred to the oxide step such that the step will become tapered.

While the present invention has been described with respect to a specific manner of practicing the invention, it is intended that the following claims shall be interpreted in accordance with the full scope of the underlying invention including any and all variations thereof which might be suggested or obvious to those skilled in the semiconductor arts.

What is claimed is:

1. A method of forming apertures having a dual tapered characteristic without requiring extra process steps comprising:
    forming a first layer of a first material over at least a portion of a second layer of a second material,
    proving an RIE faceted opening through said first layer,
    forming an aperture through said second layer using a anisotropic plasma etch which etches said second layer at a different rate that it etches said first layer such that said aperture through said second layer has tapered sidewalls.

2. The method as claimed in claim 1, wherein:
    said opening through said first layer has a peripheral edge and wherein said peripheral edge is rounded off.

3. The method as claimed in claim 1 wherein:
    said first layer is a photoresist.

4. The method as claimed in claim 3 wherein:

said second layer is an oxide.

5. A method as claimed in claim 1 wherein said plasma etch etches said second layer at a higher rate than it etches said first layer.

6. A method as claimed in claim 1 wherein:
said second layer has an undesirable topography which is planarized by said plasma etch.

7. A method as claimed in claim 6 wherein:
said opening through said first layer has a rounded peripheral edge prior to formation of said aperture through said second layer.

8. A method of forming apertures through an insulating material comprising the steps of:
providing a masking layer over said insulating material,
providing a reactive ion etched tapered aperture through said masking layer,
etching an aperture through said insulating material at the location of the tapered aperture through said masking layer whereby the taper of said aperture through said masking layer is transferred to the aperture through said insulating material and wherein said etching includes both anisotropic and isotropic characteristics in said insulating material such that a rounded peripheral edge is formed around said aperture through said insulating material.

9. A method of providing a planarized surface while tapering a substantially vertical sidewall on a semiconductor layer including the steps of:
providing a second layer over at least a portion of a first layer, said second layer having a topography including a substantially vertical sidewall,
providing a masking layer over at least a portion of said second layer,
providing a dry plasma etching environment which etches a tapered facet in said masking layer directly above said substantially vertical sidewall, and
tapering said substantially vertical sidewall using said dry plasma etch to transfer the tapered facet from said masking layer to said vertical sidewall of said second layer, wherein said dry plasma etch includes both anisotropic and isotropic characteristics such that said tapered sidewall has a rounded top edge.

10. A method as claimed in claim 9 wherein said substantially vertical sidewall is an edge of a moat and wherein said masking layer comprises a photoresist.

11. A method as claimed in claim 9 wherein said tapered facet in said masking layer has an angle of between about 5° and 45° from vertical and wherein said substantially vertical sidewall is faceted at an angle substantially identical to the angle of tapered facet in said masking layer.

12. A method as claimed in claim 9 wherein said dry plasma etch etches said second layer at a different rate than said masking layer to alter the topography of said second layer in a desirable manner at a location where said second layer is exposed to said plasma etch.

* * * * *